(12) United States Patent
Osanai

(10) Patent No.: US 6,380,037 B1
(45) Date of Patent: Apr. 30, 2002

(54) METHOD OF MANUFACTURING A SEMICONDUCTOR INTEGRATED CIRCUIT DEVICE

(75) Inventor: Jun Osanai, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/542,563

(22) Filed: Apr. 4, 2000

(30) Foreign Application Priority Data

Apr. 6, 1999 (JP) ............................................. 11-098727

(51) Int. Cl.[7] ............................................. H01L 21/336

(52) U.S. Cl. ........................ 438/294; 438/30; 438/295; 257/347; 257/350

(58) Field of Search ................................. 438/294, 404, 438/295, 24, 30; 257/347, 350, 355, 360

(56) References Cited

U.S. PATENT DOCUMENTS 5,534,722 A * 7/1996 Takasu et al. ............... 257/347
6,067,062 A * 5/2000 Takasu et al. ................ 345/87

* cited by examiner

Primary Examiner—Charles Bowers
Assistant Examiner—Hsien-Ming Lee
(74) Attorney, Agent, or Firm—Adams & Wilks

(57) ABSTRACT

A method of manufacturing a line type or area type image sensor integrated circuit device with a high resolution is provided. In a semiconductor integrated circuit device using an SOI substrate, a signal processing circuit is formed in an SOI region while a photodiode is formed in a bulk region to have a trench structure in which a diffusion layer is formed on the side walls and the bottom of the trench, and the inside of the trench is coated with an insulting film, or an insulating film and polycrystalline silicon provided with an electric potential. With such a manufacturing method, a semiconductor integrated circuit device mounting a photodiode showing sufficient S/N ratio is provided despite of its small cell size.

21 Claims, 4 Drawing Sheets

METHOD OF MANUFACTURING A SEMICONDUCTOR INTEGRATED CIRCUIT DEVICE

BACKGROUND OF THE INVENTION

1. Field of the Invention

The present invention relates generally to a method of manufacturing a semiconductor integrated circuit device that uses an SOI (silicon on insulator) type semiconductor substrate and, more particularly, to an effective technique with which a diode type photosensor and its signal processing circuit are mounted on one chip.

2. Description of the Related Art

A conventional semiconductor integrated circuit device using an SOI substrate is shown in a sectional view in FIG. 4. In the conventional device, a diode type photosensor 105 is of a so-called "planar type," and the diode type photosensor 105 and a portion of the associated signal processing circuit 103 are formed in a surface semiconductor that is insulated and isolated from the semiconductor substrate. A peripheral transistor 109 may be formed adjacent the photosensor 105 for current-voltage conversion. The signal processing circuit 103 is formed on the SOI substrate to obtain low voltage operation, low power consumption and higher operation speed, and to avoid the influence of noise.

In recent years, higher resolution is required for line type image sensor ICs and area image sensor ICs equipped with a diode type photosensor, and there has been a demand for downsizing of the cell on the part of the diode type photosensor. However, to reduce the size of the cell while keeping the S/N ratio of the photosensor at or above a given value is difficult to achieve. This is because the noise level is not decreased in proportion to the cell size, although the absolute value of a signal per unit cell becomes small to accompany the reduction of the cell size.

SUMMARY OF THE INVENTION

The present invention has been made to solve the problem above, and an object of the present invention is therefore to provide a method of manufacturing a diode type photosensor that has an adequate S/N ratio with a reduced cell size.

In order to attain the above object, the present invention takes the following measures:

(1) A method of manufacturing a semiconductor integrated circuit device using an SOI semiconductor substrate, the main surface thereof for forming a device being insulated and isolated by a buried insulating layer formed in the semiconductor substrate, the method being characterized by comprising the steps of:

forming the buried insulating layer in a part of the main surface of the substrate; and forming a diode type photosensor in a region of the main surface of the substrate where the buried insulating layer is not formed.

(2) A method of manufacturing a semiconductor integrated circuit device using an SOI semiconductor substrate, the main surface thereof for forming a device being insulated and isolated by a buried insulating layer formed in the semiconductor substrate, the method being characterized by comprising the steps of:

partially removing from the semiconductor substrate with the buried insulating film formed across its entire main surface, the semiconductor substrate main surface and buried insulating layer; and forming a diode type photosensor in the main surface of the substrate in a region where the removal has been performed.

(3) A method of manufacturing a semiconductor integrated circuit device, characterized in that the manufacturing method of the diode type photosensor comprises the steps of:

forming a trench in the semiconductor substrate; and forming a diffusion layer on the side walls and the bottom of the trench.

(4) A method of manufacturing a semiconductor integrated circuit device, characterized in that the manufacturing method of the diode type photosensor further comprises the step of filling up with an insulating film the inside of the trench formed in the semiconductor substrate.

(5) A method of manufacturing a semiconductor integrated circuit device, characterized in that the manufacturing method of the diode type photosensor further comprises the step of filling up with polycrystalline silicon the inside of the trench formed in the semiconductor substrate.

DETAILED DESCRIPTION OF THE PREFERRED EMBODIMENTS

Embodiments of the present invention will now be described with reference to the attached drawings.

Figure 1A:
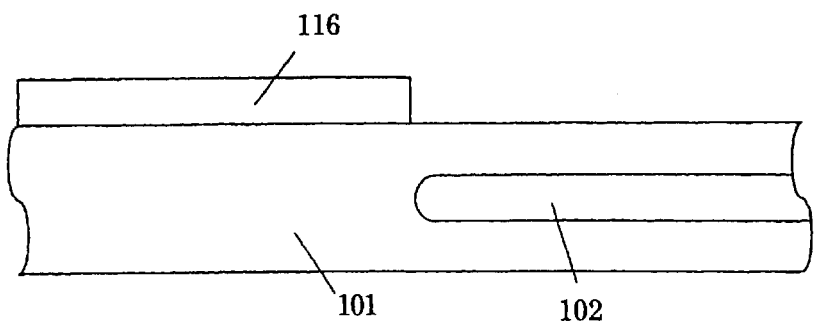
FIGS. 1A to 1D are sectional views of the process steps showing a manufacturing method of a semiconductor integrated circuit device according to the present invention.

FIGS. 1A to 1D are sectional views schematically showing an embodiment of a method of manufacturing a semiconductor integrated circuit according to the present invention. On the surface of a semiconductor substrate 101 that is formed of a P type single crystal silicon, a photoresist pattern 116 is formed using photolithography to partially implant oxygen ions by so-called SIMOX (separation by implanted oxygen) method. FIG. 1A shows this step. Next, the photoresist is released and the implanted oxygen ions then react with silicon through a heat treatment of about 1,300° C. to selectively form a buried insulating film 102 in the semiconductor substrate 101.

With the SIMOX method, the thickness of a silicon active layer does not exceed 0.1 $\mu$m or so. In the case where a somewhat thicker layer than that is needed, crystals are epitaxially grown to adjust the thickness of the active layer.

Figure 1B:
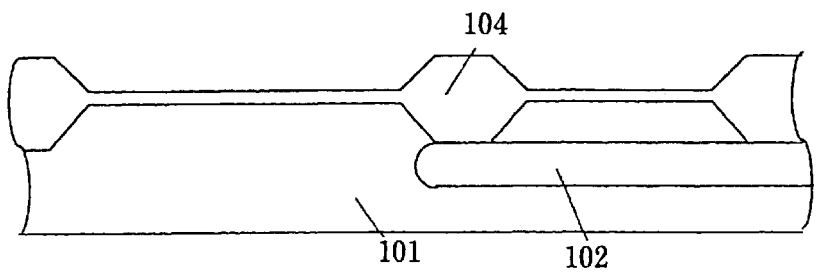
Figure 1C:
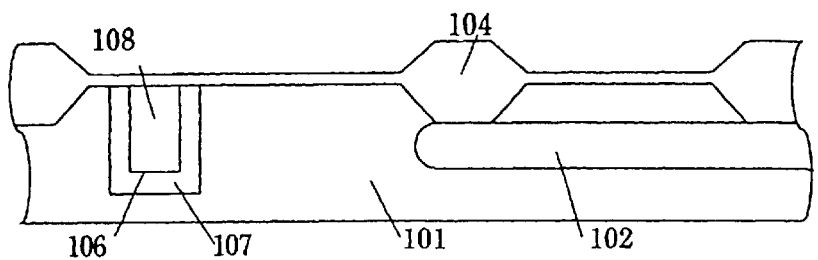

Then a method called LOCOS is used to form separately from each other a field insulating film 104, that is a device isolating region, separately from a portion to be an active device region. This is shown in FIG. 1B. A trench 106 is next formed by photolithography and dry etching in a portion of the semiconductor substrate 101 where the buried insulating film is not formed, which is referred to as a bulk region. Using the solid diffusion method or oblique ion implantation method, a diffusion layer 107 is formed on the side walls and the bottom of the trench 106 to fill up the trench 106 with an insulating film by CVD or another method. FIG. 1C illustrates the device at this point. The width of the trench 106 ranges from 0.3 μm to 3.0 μm and the depth thereof is about 1 to 10 μm. When the diffusion layer 107 is N type, it is formed by phosphorus or arsenic ion implantation or by the solid diffusion method using AsSG (As silicate glass), and the concentration ranges from $1 \times 10^{17}/cm^3$ to $1 \times 10^{20}/cm^3$. Formation of an insulating film 108 filling inside the trench by CVD can be accomplished through etch back after coating the entire surface of the inside of the trench and the semiconductor substrate main surface with an insulating film. Thermal oxidation may be conducted before the coating with the insulating film.

Figure 1D:
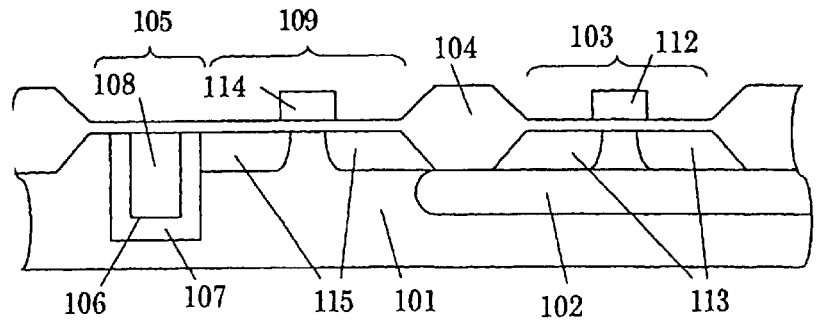

Subsequent steps are similar to normal formation steps of MOS: a gate insulating film is formed, gate electrodes 112, 114 are formed using polycrystalline silicon or the like, and diffusion layers 113, 115 to serve as a source and a drain are then formed. This is shown in FIG. 1D.

With such a structure, the small size of the flat surfaces is supplemented by a large effective region in the diffusion layer which can collect carriers generated through absorbing light, making it possible to form a compact cell without reducing the S/N ratio. This structure is effective particularly in the longwave region.

Figure 2A:
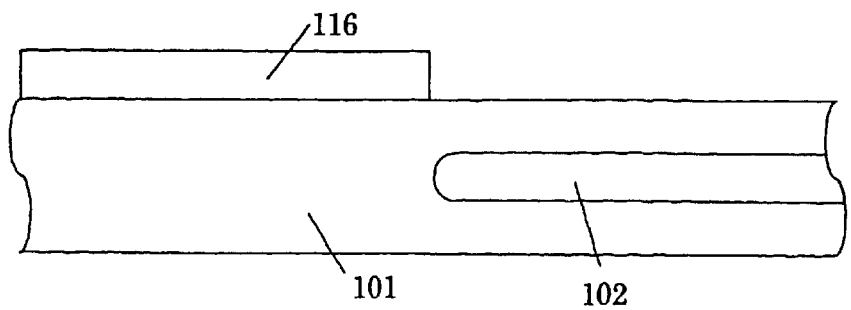
FIGS. 2A to 2D are sectional views of the process steps showing another manufacturing method of a semiconductor integrated circuit device according to the present invention.
Figure 2B:
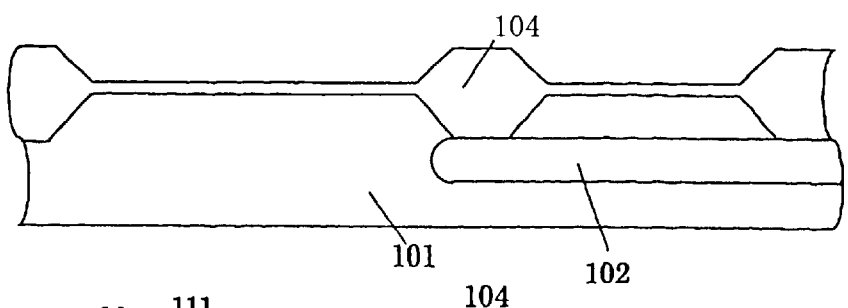

FIGS. 2A to 2D are sectional views schematically showing another embodiment of a method of manufacturing a semiconductor integrated circuit device according to the present invention. In FIGS. 2A and 2B, a buried insulating film 102 is selectively formed in a semiconductor substrate 101 and a device isolating region and an active region are formed with the LOCOS, in a manner similar to that shown in FIGS. 1A and 1B.

Figure 2C:
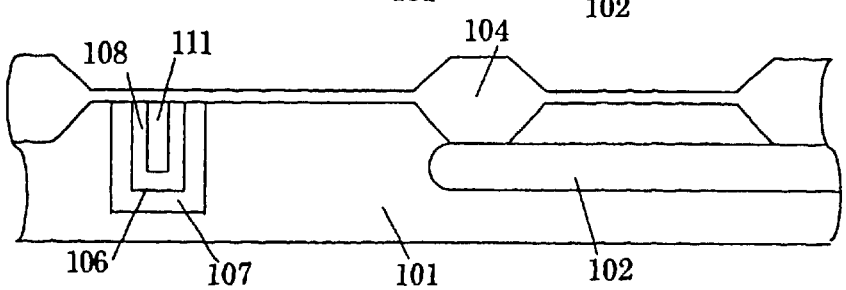

A trench 106 is next formed by photolithography or dry etching in a bulk region, and a diffusion layer 107 is formed with the solid diffusion method or oblique ion implantation method on the side walls and the bottom of the trench 106 to form an insulating layer 110 through thermal oxidation. Then the entire surface of the inside of the trench 106 and the semiconductor main surface are coated with polycrystalline silicon by the CVD to etch back the coated area. This step is illustrated in FIG. 2C. The width of the trench 106 is, as in FIG. 1C, 0.3 to 3.0 μm and the depth thereof is about 1 to 10 μm. Polycrystalline silicon 111 filling inside the trench is doped with phosphorus at the same time as the coating, or goes through the predeposition method (POCL3 diffusion in a furnace) after the coating, to have conductivity.

Figure 2D:
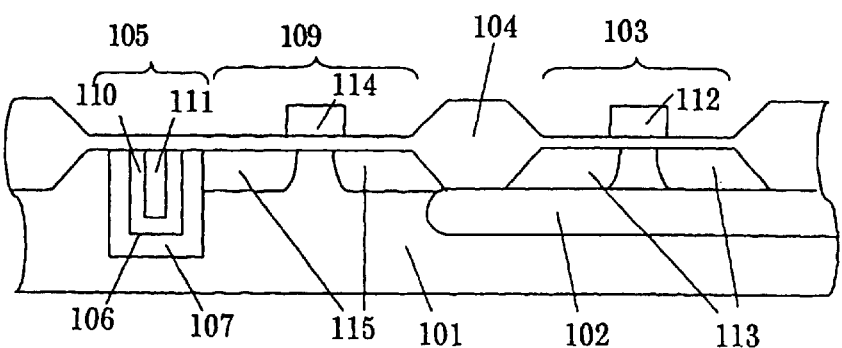

Following a normal formation step of the MOS, as in FIG. 1D, a gate insulating film is formed, gate electrodes 112, 114 are formed using polycrystalline silicon or the like, and diffusion layers 113, 115 to serve as a source and a drain are then formed. This is shown in FIG. 2D.

This method is capable of keeping a base insulating film from losing its thickness by ensuring high selectivity of the polycrystalline silicon to the insulating film in etching back the polycrystalline silicon, and, accordingly, is a more stable manufacturing method compared to the method illustrated in FIGS. 1A to 1D.

To apply an electric potential to the polycrystalline silicon 111 makes it an even more effective structure. The main source for noise signals detected by the photodiode is interface levels spotted throughout the interface between the semiconductor substrate surface and the insulating film. The interface levels are substantially reduced by giving the polycrystalline silicon 111 an electric potential with which the interface levels are closed up with holes. The noise level is thus drastically reduced, making the structure effective also in view of the S/N ratio.

Figure 3A:
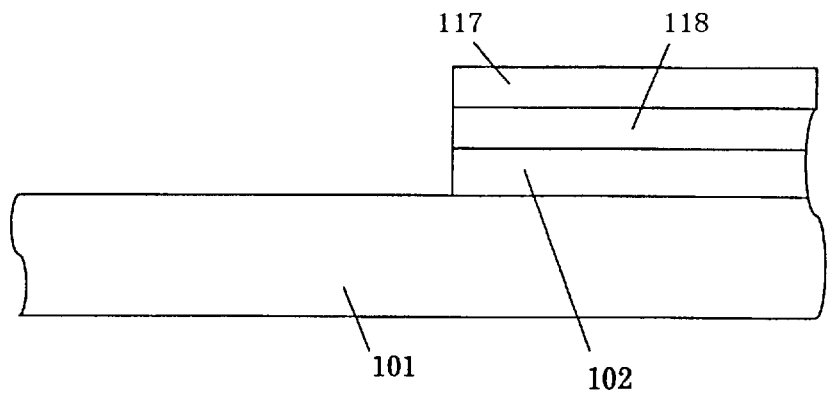
FIGS. 3A and 3B are sectional views of the process steps showing still another manufacturing method of a semiconductor integrated circuit device according to the present invention.

FIGS. 3A and 3D are sectional views schematically showing still another embodiment of a method of manufacturing a semiconductor integrated circuit device according to the present invention. On the surface of an SOI type semiconductor substrate 101 with a buried insulating film formed on its entire surface by the SIMOX or the pasting method, a photoresist pattern 117 is formed by photolithography. A semiconductor layer above the buried insulating film 102 is partially removed by dry etching. Further, the buried insulating film 102 is partially removed by etching using as masks the photoresist 117 and a semiconductor layer 118. This is illustrated in FIG. 3A.

The partial removal of the buried insulating film may be conducted using only the semiconductor layer 118 as a mask after the photoresist 117 is removed. The buried insulating film is removed by, normally, wet etching so as not to damage the exposed semiconductor substrate 101. However, dry etching may be used if it gives only a limited damage.

Figure 3B:
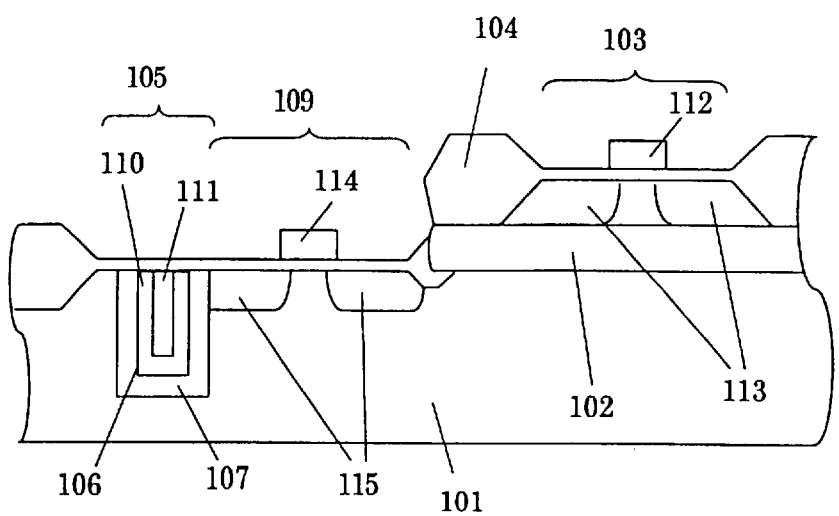
Figure 4:
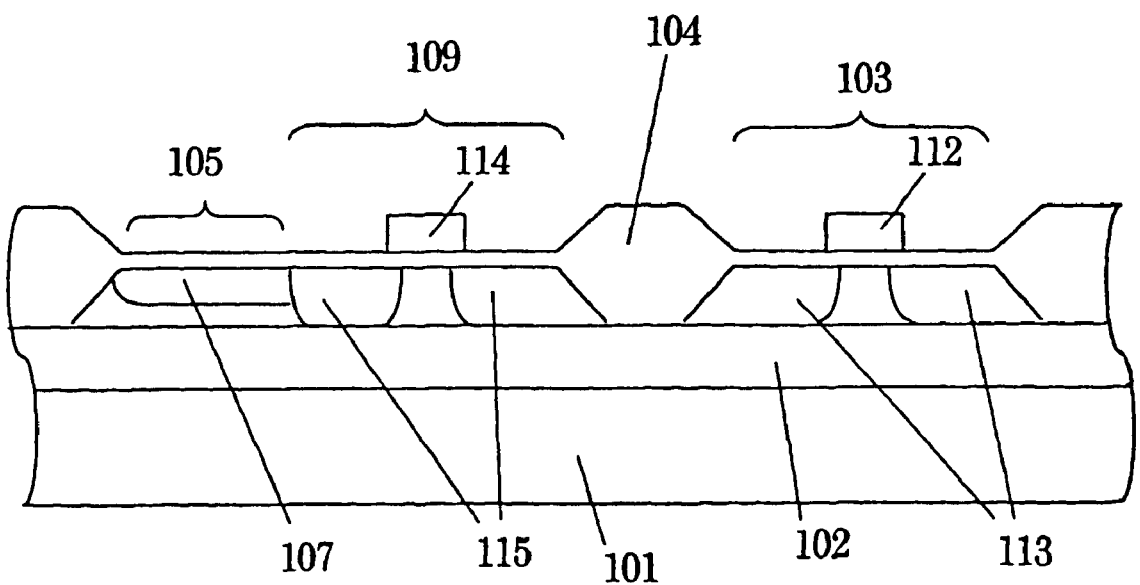
FIG. 4 is a sectional view schematically showing an example of a conventional semiconductor integrated circuit device.

After that comes formation of a device isolating region, a trench type phototransistor, and a MOS transistor, similar to the manufacturing method illustrated in FIGS. 2A to 2D. FIG. 3B shows the device at this point. The effect of the device characteristic obtained by this manufacturing method is the same as those in embodiments illustrated in FIGS. 1A to 1D and FIGS. 2A to 2D.

As described above, the manufacturing method of the present invention realizes a photo diode high in S/N ratio and compact in size, providing a line or area type image sensor integrated circuit device with a high resolution.

What is claimed is:

1. A method of manufacturing a semiconductor integrated circuit device using an SOI semiconductor substrate formed of a semiconductor substrate having a buried insulating layer formed therein, a main surface of the SOI substrate having a device formed therein, the device being insulated and isolated by the buried insulating layer, the method comprising the steps of:

forming the buried insulating layer in a portion of a main surface of the semiconductor substrate; and forming a photosensor diode in a region of the main surface of the semiconductor substrate where the buried insulating layer is not formed by forming a trench in the semiconductor substrate and forming a diffusion layer on side walls and a bottom of the trench.

2. A method of manufacturing a semiconductor integrated circuit device according to claim 1; wherein the step of forming the photosensor diode further comprises the step of filling the trench with an insulating film.

3. A method of manufacturing a semiconductor integrated circuit device according to claim 1; wherein the step of forming the photosensor diode further comprises the step of filing the trench with polycrystalline silicon.

4. A method of manufacturing a semiconductor integrated circuit device according to claim 1; further comprising the step of forming a peripheral circuit connected to the photosensor diode in a region of the semiconductor substrate where the buried insulating layer is not formed.

5. A method of manufacturing a semiconductor integrated circuit device according to claim 1; wherein the device formed in the main surface of the SOI substrate and being insulated and isolated by the buried insulating layer comprises a signal processing circuit for processing an output signal of the photosensor diode.

6. A method of manufacturing a semiconductor integrated circuit device using an SOI semiconductor substrate formed of a semiconductor substrate having a buried insulating layer formed therein, a main surface of the SOI substrate having a device formed therein, the device being insulated and isolated by the buried insulating layer, the method comprising the steps of:

removing, from the semiconductor substrate with the buried insulating film formed across its entire surface, a portion of the semiconductor substrate main surface and a portion of the buried insulating layer underlying the removed portion of the main surface; and forming a photosensor diode in a region of the semiconductor substrate at which the removal step has been performed by forming a trench in the semiconductor substrate, and forming a diffusion layer on side walls and a bottom of the trench.

7. A method of manufacturing a semiconductor integrated circuit device according to claim 6; wherein the step of forming the photosensor diode further comprises the step of filling the trench with an insulating film.

8. A method of manufacturing a semiconductor integrated circuit device according to claim 6; wherein the step of forming the photosensor diode further comprises the step of filing the trench with polycrystalline silicon.

9. A method of manufacturing a semiconductor integrated circuit device according to claim 6; further comprising the step of forming a peripheral circuit connected to the photosensor diode in a region of the semiconductor substrate where the buried insulating layer is not formed.

10. A method of manufacturing a semiconductor integrated circuit device according to claim 6; wherein the device formed in the main surface of the SCI substrate and being insulated and isolated by the buried insulating layer comprises a signal processing circuit for processing an output signal of the photosensor diode.

11. A method of manufacturing a semiconductor integrated circuit device comprising the steps of: forming a buried insulating layer beneath a portion of a main surface of a semiconductor substrate; forming a photosensor diode in a portion of the main surface of the semiconductor substrate at which the buried insulating layer is not formed; and forming a peripheral circuit connected to the photosensor diode in the portion of the main surface of the semiconductor substrate at which the buried insulating layer is formed.

12. A method of manufacturing a semiconductor integrated circuit device according to claim 11; wherein the step of forming the photosensor diode comprises the steps of forming a trench in the main surface of the semiconductor substrate, and forming a diffusion layer on a side wall and a bottom wall of the trench.

13. A method of manufacturing a semiconductor integrated circuit device according to claim 11; wherein the step of forming the buried insulating layer comprises the steps of forming an insulating layer over the main surface of the semiconductor substrate, and removing a portion of the insulating layer and the main surface of the semiconductor substrate so that only a portion of the main surface has the buried insulating layer; and wherein the step of forming the photosensor diode comprises forming the photosensor diode in a region of the main surface of the semiconductor substrate where a portion of the insulating layer and the main surface have been removed.

14. A method of manufacturing a semiconductor integrated circuit device according to claim 13; wherein the step of forming the photosensor diode comprises the steps of forming a trench in the main surface of the semiconductor substrate, and forming a diffusion layer on a side wall and a bottom wall of the trench.

15. A method of manufacturing a semiconductor integrated circuit device according to claim 14; wherein the steps of forming the diffusion layer comprises the step of performing one of solid diffusion of ions and oblique ion implantation.

16. A method of manufacturing a semiconductor integrated circuit device according to claim 14; wherein the step of forming the diffusion layer comprises the step of performing one of implanting phosphorus or arsenic ions and performing solid diffusion using As silicate glass at a concentration within the range of $1 \times 10^{17}/cm^3$ to $1 \times 10^{20}/cm^3$.

17. A method of manufacturing a semiconductor integrated circuit device according to claim 14; wherein the step of forming the photosensor diode further comprises the step of filling the trench with an insulating film.

18. A method of manufacturing a semiconductor integrated circuit device according to claim 14; wherein the step of filling the trench with the insulating film comprises the steps of coating an entire surface of an inside of the trench with an insulating film and removing a portion of the coating outside the trench.

19. A method of manufacturing a semiconductor integrated circuit device according to claim 18; wherein the step of filling the trench with the insulating film further comprises the step of performing thermal oxidation before the step of coating the inside of the trench with the insulating film.

20. A method of manufacturing a semiconductor integrated circuit device according to claim 14; wherein the step of forming the photosensor diode further comprises the step of filing the trench with polycrystalline silicon.

21. A method of manufacturing a semiconductor integrated circuit device according to claim 20; further comprising the step of performing thermal oxidation before the step of filling the trench with polycrystalline silicon.

* * * * *